(12) United States Patent
Lou et al.

(10) Patent No.: US 10,013,124 B2
(45) Date of Patent: Jul. 3, 2018

(54) ARRAY SUBSTRATE, TOUCH SCREEN, TOUCH DISPLAY DEVICE, AND FABRICATION METHOD THEREOF

(71) Applicants: Shanghai Tianma Micro-electronics Co., Ltd., Shanghai (CN); Tianma Micro-electronics Co., Ltd., Shenzhen (CN)

(72) Inventors: Junhui Lou, Shanghai (CN); Tianyi Wu, Shanghai (CN); Yong Wu, Shanghai (CN)

(73) Assignees: Shanghai Tianma Micro-electronics Co., Ltd., Shanghai (CN); Tianma Micro-electronics Co., Ltd., Shenzhen (CN)

( * ) Notice: Subject to any disclaimer, the term of this patent is extended or adjusted under 35 U.S.C. 154(b) by 168 days.

(21) Appl. No.: 15/051,283

(22) Filed: Feb. 23, 2016

(65) Prior Publication Data

US 2017/0160841 A1     Jun. 8, 2017

(30) Foreign Application Priority Data

Dec. 8, 2015    (CN) .......................... 2015 1 0898574

(51) Int. Cl.
*G09G 3/36*         (2006.01)
*G06F 3/041*        (2006.01)
(Continued)

(52) U.S. Cl.
CPC ............ *G06F 3/044* (2013.01); *G06F 3/0412* (2013.01); *G06F 2203/04103* (2013.01);
(Continued)

(58) Field of Classification Search
CPC .......... H01L 27/14609; H01L 27/3244; H01L 27/124; G09G 3/36; G09G 3/3659;
(Continued)

(56) References Cited

U.S. PATENT DOCUMENTS 6,087,648 A  *  7/2000  Zhang ................. G02F 1/13454
                                                    250/208.1
2006/0044300 A1 * 3/2006 Koyama .................. G09G 3/30
                                                    345/207

(Continued)

FOREIGN PATENT DOCUMENTS

| CN | 101866228 A | 10/2010 |
| CN | 103926729 A | 7/2014 |
| CN | 104020892 A | 9/2014 |

*Primary Examiner* — Michael J Eurice
(74) *Attorney, Agent, or Firm* — Anova Law Group, PLLC

(57) ABSTRACT

An array substrate, a touch screen, a touch display device and fabrication methods are provided. The array substrate includes a base substrate having a display region and a non-display region adjacent to the display region, a plurality of touch leading wires disposed in the display region, a plurality of touch electrode blocks disposed in the display region and electrically connected to the plurality of touch leading wires, and a peripheral driving circuit having a plurality of driving transistors disposed in the non-display region. Each driving transistor includes a top gate electrode formed at a same layer as the touch leading wire.

25 Claims, 9 Drawing Sheets

US 10,013,124 B2
Page 2

(51) Int. Cl.
*G06F 3/044* (2006.01)
*H01L 27/32* (2006.01)
*H01L 27/146* (2006.01)
*H01L 27/12* (2006.01)

(52) U.S. Cl.
CPC ............ *G09G 3/36* (2013.01); *G09G 3/3659* (2013.01); *G09G 2300/0426* (2013.01); *G09G 2310/0262* (2013.01); *G09G 2310/0297* (2013.01); *H01L 27/124* (2013.01); *H01L 27/14609* (2013.01); *H01L 27/3244* (2013.01)

(58) Field of Classification Search
CPC ... G09G 2300/0426; G09G 2310/0262; G09G 2310/0297; G06F 3/0412; G06F 3/047; G06F 2203/04103; G02F 1/136286
See application file for complete search history.

(56) References Cited

U.S. PATENT DOCUMENTS

| | | | | |
|---|---|---|---|---|
| 2006/0109222 A1* | 5/2006 | Lee | ............. | G02F 1/13338 345/88 |
| 2006/0113539 A1* | 6/2006 | Sano | ............. | H01L 29/51 257/59 |
| 2006/0186497 A1* | 8/2006 | Nishi | ............. | H01L 27/14643 257/428 |
| 2006/0260675 A1* | 11/2006 | Sugawara | ....... | H01L 31/022408 136/252 |
| 2009/0159893 A1* | 6/2009 | Otani | ............. | H01L 31/112 257/66 |
| 2012/0068944 A1* | 3/2012 | Oh | ............. | G02F 1/13338 345/173 |
| 2012/0069257 A1* | 3/2012 | Oh | ............. | G02F 1/13338 349/42 |
| 2012/0154335 A1* | 6/2012 | Chan | ............. | H01L 31/12 345/175 |
| 2013/0088460 A1 | 4/2013 | Ahn et al. | | |
| 2014/0078106 A1* | 3/2014 | Yao | ............. | G06F 3/044 345/174 |
| 2014/0092326 A1* | 4/2014 | Zhou | ............. | G06F 3/0412 349/12 |
| 2014/0176494 A1* | 6/2014 | Huang | ............. | G02F 1/13338 345/174 |
| 2014/0184940 A1* | 7/2014 | Ma | ............. | G02F 1/13338 349/12 |
| 2014/0253473 A1* | 9/2014 | Kim | ............. | G06F 3/0416 345/173 |
| 2015/0185902 A1* | 7/2015 | Liu | ............. | G06F 3/044 345/174 |
| 2015/0277633 A1* | 10/2015 | Jiang | ............. | G06F 3/044 345/174 |
| 2015/0380467 A1* | 12/2015 | Su | ............. | H01L 27/323 257/40 |
| 2016/0011705 A1* | 1/2016 | Huang | ............. | G06F 3/044 345/174 |
| 2016/0188087 A1* | 6/2016 | Sun | ............. | G06F 3/0416 345/173 |
| 2016/0188091 A1* | 6/2016 | Sun | ............. | G06F 3/0416 345/174 |
| 2016/0225787 A1* | 8/2016 | Katsuta | ............. | H01L 27/124 |
| 2016/0240163 A1* | 8/2016 | Yamamoto | ............. | G09G 3/3696 |
| 2016/0247478 A1* | 8/2016 | Ishige | ............. | G09G 3/3677 |
| 2016/0266672 A1* | 9/2016 | Inagaki | ............. | G09F 9/30 |
| 2016/0266706 A1* | 9/2016 | Lu | ............. | G06F 3/0416 |
| 2016/0293121 A1* | 10/2016 | Zeng | ............. | G09G 3/3611 |
| 2016/0293122 A1* | 10/2016 | Wang | ............. | G09G 3/3607 |
| 2016/0328055 A1* | 11/2016 | Wu | ............. | G09G 5/003 |
| 2017/0003775 A1* | 1/2017 | Hu | ............. | G06F 3/044 |
| 2017/0160841 A1* | 6/2017 | Lou | ............. | G06F 3/047 |
| 2017/0179160 A1* | 6/2017 | Takahashi | ............. | G09G 3/2092 |
| 2017/0262109 A1* | 9/2017 | Choi | ............. | G06F 3/0412 |

* cited by examiner

ARRAY SUBSTRATE, TOUCH SCREEN, TOUCH DISPLAY DEVICE, AND FABRICATION METHOD THEREOF

CROSS-REFERENCES TO RELATED APPLICATIONS

This application claims the priority of Chinese patent application No. CN201510898574.X, filed on Dec. 8, 2015, the entire content of which is incorporated herein by reference.

FIELD OF THE DISCLOSURE

The present disclosure relates to the field of display technology and, more particularly, relates to an array substrate, a touch screen, and a touch display device, and fabrication techniques thereof.

BACKGROUND

In the field of liquid crystal display, the active layer of thin film transistor (TFT) often uses silicon-based materials which have a good stability and processability. Silicon-based materials are mainly divided into two categories: amorphous silicon and polycrystalline silicon. Amorphous silicon offers very low carrier mobility. While polycrystalline silicon offers higher mobility, polycrystalline silicon-based devices often have poor uniformity, low yield and high unit price. Thus, technologies of manufacturing transparent metal-oxide semiconductors as the active layer of TFTs (i.e., metal-oxide TFTs), which are adopted in electronic devices and optical devices, have attracted widespread attention recently. Field-effect amorphous indium gallium zinc oxide (a-IGZO) TFTs, have been widely used because of their higher carrier mobility, higher on-to-off current ratio, better large-size uniformity, and lower processing temperature, etc.

Metal-oxide TFTs are often divided into two categories: bottom-gate TFTs and top-gate TFTs. A bottom-gate metal-oxide TFT includes a substrate, in which a gate, a gate insulating layer, a metal-oxide semiconductor layer, a source/drain conductive layer, and a protective layer are sequentially disposed. A portion of the metal-oxide semiconductor layer between the source and the drain defines a channel or channel region or channel layer.

In practical applications, the metal-oxide TFTs are inevitably irradiated by ambient light. Thus, due to the nature of the metal-oxide semiconductor layer, such light irradiation can cause light-induced defects in the metal-oxide semiconductor layer. When an external voltage is applied to the metal-oxide TFT, these light-induced defects diffuse to an interface between the channel and the gate insulating layer, where an interfacial state (i.e., the semiconductor interface is located in energy levels of a forbidden band and quickly exchange charges with the semiconductor) can be formed. The interfacial state can result a shift in the threshold voltage (Vth) of the metal-oxide TFT, i.e., voltage necessary to turn on the metal-oxide TFT, and accordingly affect the stability of the metal-oxide TFT.

To eliminate the light-induced defects in the metal-oxide TFTs under light irradiation, currently two methods are often adopted.

The first method is to grow a protective layer (e.g., an ESL or a passivation layer) on the channel layer, such as $SiO_2$, $Al_2O_3$, $Y_2O_3$, etc., to increase the barrier for generating light-induced defects in the back channel region under light irradiation, and accordingly reduce the influence of the light irradiation on the metal-oxide TFT performance. However, if the light irradiation is strong, the light irradiation is still able to penetrate the protective layer on the back channel region and the performance of the metal-oxide TFT is still affected.

The second method is to adopt an opaque metal layer or multiple layers as a light-shielding layer to cover the semiconductor channel region and to eliminate the influence of the light irradiation on the stability of the semiconductor device (i.e., the metal-oxide TFT). However, the fabrication of the light-shielding layer requires an additional photomask and, thus, the fabrication cost and fabrication complexity are increased accordingly.

The disclosed array substrate and fabrication method thereof, and the corresponding touch screen and touch display device are directed to solve one or more problems in the art.

BRIEF SUMMARY OF THE DISCLOSURE

One aspect of the present disclosure provides an array substrate. The array substrate includes a base substrate having a display region and a non-display region adjacent to the display region, a plurality of touch leading wires disposed in the display region, a plurality of touch electrode blocks disposed in the display region and electrically connected to the plurality of touch leading wires, and a peripheral driving circuit having a plurality of driving transistors disposed in the non-display region. Each driving transistor includes a top gate electrode formed at a same layer as the touch leading wire.

Another aspect of the present disclosure provides a fabrication method for an array substrate. The fabrication method includes providing a base substrate having a display region and a non-display region; forming a plurality of gate electrodes in the display region and a plurality of bottom gate electrodes in the non-display region at a same layer; forming a display-region gate electrode insulating layer and a non-display-region gate electrode insulating layer at a same layer; forming a first active layer in the display region and a second active layer in the non-display region at a same layer; forming a plurality of first source electrodes and a plurality of first drain electrodes in the display region, a plurality of second source electrodes and a plurality of second drain electrodes in the non-display at a same layer; forming a display-region passivation layer and a non-display-region passivation layer at a same layer; and forming a plurality of touch leading wires in the display region and a plurality of top gate electrodes in the non-display region at a same layer.

Another aspect of the present disclosure provides a touch display device. The touch display device includes a touch screen having an array substrate. The array substrate includes a base substrate having a display region and a non-display region adjacent to the display region, a plurality of touch leading wires disposed in the display region, a plurality of touch electrode blocks disposed in the display region and electrically connected to the plurality of touch leading wires, and a peripheral driving circuit having a plurality of driving transistors disposed in the non-display region. Each driving transistor includes a top gate electrode formed at a same layer as the touch leading wire.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Hereinafter, embodiments consistent with the disclosure will be described with reference to drawings. Wherever possible, the same reference numbers will be used throughout the drawings to refer to the same or like parts. It is apparent that the described embodiments are some but not all of the embodiments of the present invention. Based on the disclosed embodiments, persons of ordinary skill in the art may derive other embodiments consistent with the present disclosure, all of which are within the scope of the present invention.

Figure 1:
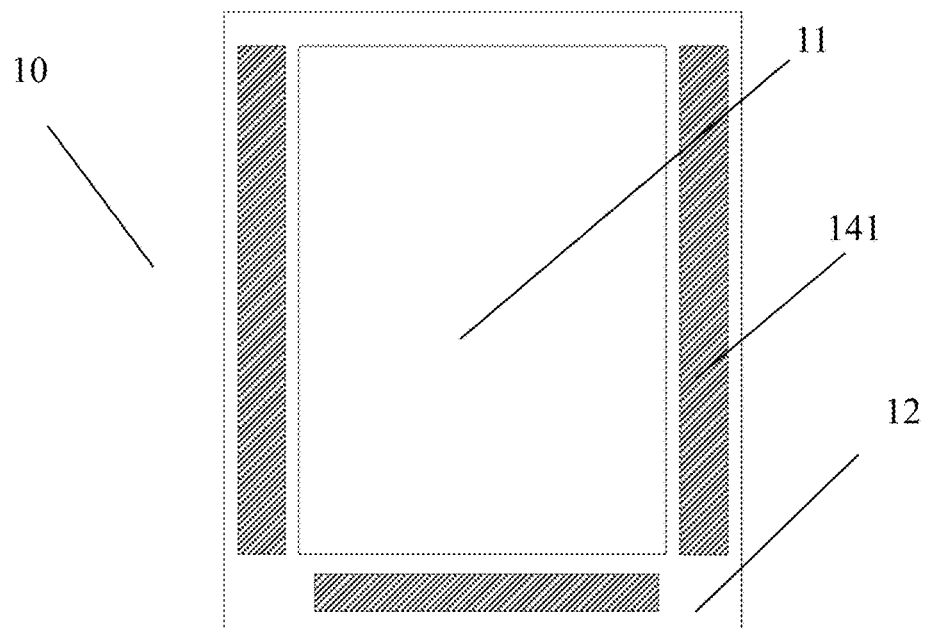
FIG. 1 illustrates a top view of an exemplary array substrate consistent with disclosed embodiments.

The present disclosure provides an array substrate. FIG. 1 illustrates a top view of an exemplary array substrate consistent with disclosed embodiments. As shown in FIG. 1, the array substrate 10 may include a display region 11 and a non-display region 12. The non-display region 12 may be disposed on at least one side of the display region 11, or may be disposed surrounding the display region 11 as shown in FIG. 1.

Further, the display region 11 of the array substrate may include a plurality of pixel units for displaying images, and the plurality of pixel units may be arranged in a matrix (not drawn in FIG. 1). An external driving circuit 141 may be disposed on the non-display region 12, which may include a plurality of data line driving circuits, a plurality of scanning line driving circuits, a plurality of touch driving circuits, a plurality of terminals connecting external circuits, etc. (not drawn in FIG. 1). For example, the data line driving circuits and the terminals connecting external circuits may be disposed at one side the array substrate 10 (i.e., the horizontal shaded area in FIG. 1). The scanning line driving circuits and the touch driving circuits may be disposed at two sides of the array substrate 10 (i.e., the two vertical shaded areas in FIG. 1), in which the two sides may be adjacent to the side disposed with the data line driving circuit and the terminals connecting external circuits.

Figure 2:
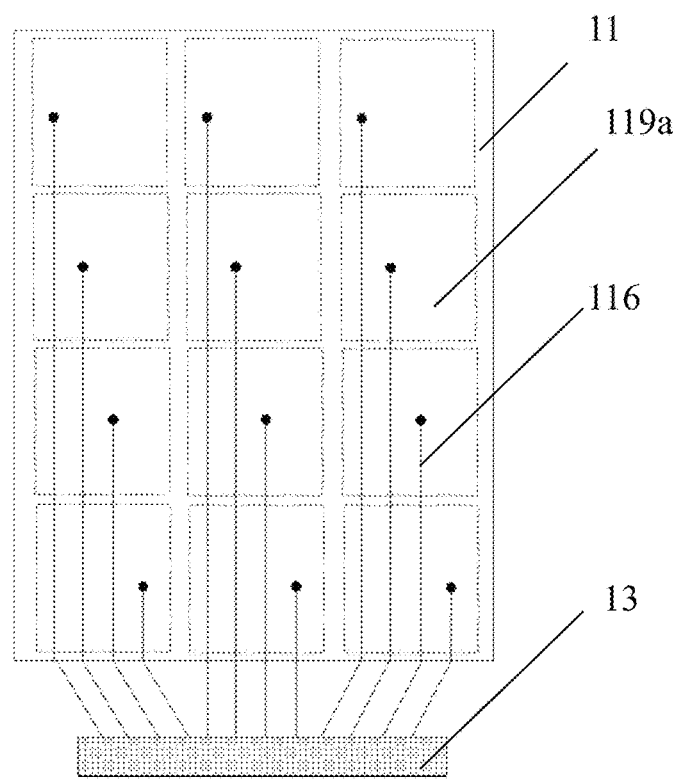
FIG. 2 illustrates a top view of a display region in an exemplary array substrate consistent with disclosed embodiments.

FIG. 2 illustrates a top view of a display region in an exemplary array substrate consistent with disclosed embodiments. A shown in FIG. 2, the display region 11 of the array substrate 10 may be connected to an external driving integrated circuit (IC) 13. A plurality of touch electrode blocks 119a may be disposed on the display region 11, which may be used as touch electrodes only, or multiplexed as common electrode blocks. The common electrode blocks may be formed by dividing a common electrode disposed on the array substrate.

That is, the common electrode block and the touch electrode block may be multiplexed onto one electrode block. Multiplexing of the common electrode block and the touch electrode block may reduce the thickness of a touch screen display panel and, meanwhile, the fabrication of the multiplexing electrode blocks may only involve one etching process. Thus, the number of the fabrication steps may be reduced and the manufacturing efficiency may be improved.

Each touch electrode block 119a may be electrically connected to the touch driving circuit in the non-display region 12 or a driving circuit in the external driving IC 13 through a touch leading wire 116, and the touch leading wire 116 may provide a touch signal or a common signal for displaying images to the touch electrode block 119a based on a time-sharing driving method. For example, the touch signal and the common signal may be created based on the time-sharing driving method, at one time period, the touch leading wire 116 may provide the touch signal to the touch electrode block 119a, and at another time period, the touch leading wire 116 may provide the common signal for displaying images to the touch electrode block 119a.

Figure 3:
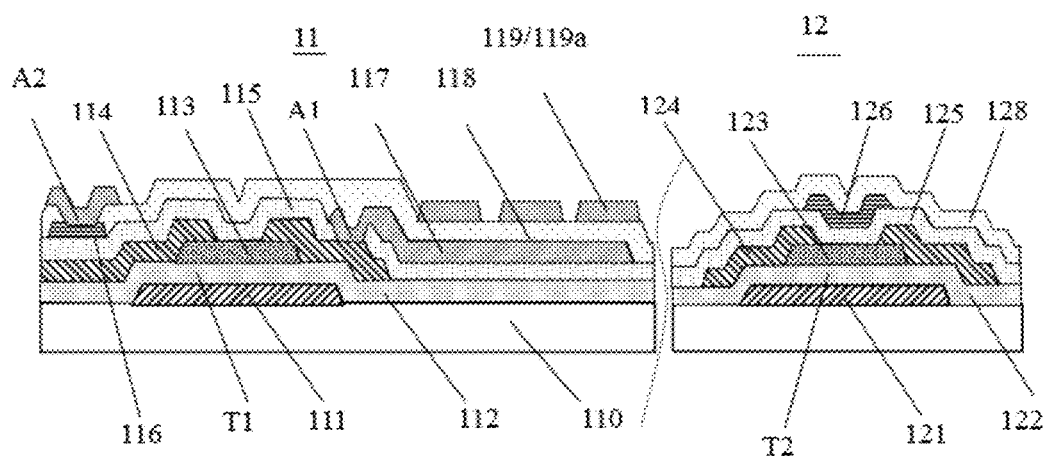
FIG. 3 illustrates a cross-sectional view of an exemplary array substrate consistent with disclosed embodiments.

FIG. 3 illustrates a cross-sectional view of an exemplary array substrate consistent with disclosed embodiments. As shown in FIG. 3, the array substrate may include the display region 11 and the non-display region 12.

Further, the array substrate may include a base substrate 110, and the display region 11 may include a plurality of pixel units. Each pixel unit may include a displaying transistor T1, a display-region passivation layer 115, a touch leading wire 116, a pixel electrode 117 and a common electrode 119. In particular, the displaying transistor T1 may control the pixel unit, the display-region passivation layer 115 may be disposed on the displaying transistor T1, and the touch leading wire 116 may be disposed on a side of the display-region passivation layer 115 away from the base substrate 110. Further, the pixel electrode 117 may be electrically connected to a first source electrode (first drain electrode) 114 of the displaying transistor T1 through a first through hole A1 penetrating the display-region passivation layer 115. A display-region insulating interlayer 118 may be disposed between the pixel electrode 117 and the common electrode 119.

In the disclosed embodiments, the common electrode 119 may be divided into a plurality of blocks, i.e., a plurality of common electrode blocks. The common electrode block may be multiplexed with the touch electrode block 119a. Each touch electrode block 119a may be electrically connected to the touch leading wire 116 through a second through hole A2 penetrating the display-region insulating interlayer 118, and the touch leading wire 116 may transmit the touch signal to the touch electrode block 119a.

Further, the non-display region 12 may include a peripheral driving circuit, which may include a plurality of driving transistors T2 and a non-display-region insulating interlayer 128 disposed on the driving transistors T2. The non-display-region insulating interlayer 128 in the non-display region 12 and the display-region insulating interlayer 118 in the display region 11 may be formed at the same layer and by the same material.

The displaying transistor T1 may be a thin film transistor (TFT) having a bottom gate electrode (i.e., bottom-gate TFT). The displaying transistor T1 may include a gate electrode 111, a display-region gate electrode insulating layer 112, a first active layer 113 and the first source electrode (the first drain electrode) 114.

The gate electrode 111 may be first disposed on the base substrate 110, the display-region gate electrode insulating layer 112 may be disposed on the gate electrode 111, and the first active layer 113 may be disposed on a side of the display-region gate electrode insulating layer 112 away from the base substrate 110. That is, the gate electrode 111, the display-region gate electrode insulating layer 112, and the first active layer 113 may be sequentially disposed on the base substrate 110.

The first source electrode (the first drain electrode) 114 may be disposed at a side of the display-region gate electrode insulating layer 112 away from the base substrate 110 and a side of the first active layer 113 away from the base substrate 110. For example, as shown in FIG. 3, the first source electrode (the first drain electrode) 114 may partially contact the surface of the display-region gate electrode insulating layer 112 away from the base substrate 110 and, meanwhile partially contact the surface of the first active layer 113 away from the base substrate 110.

The first active layer 113 may be disposed between the display-region gate electrode insulating layer 112 and the first source electrode (the first drain electrode) 114. The first source electrode (first drain electrode) 114 may be formed on the first active layer 113 and, meanwhile, the first source electrode and the first drain electrode may be arranged opposite to each other and separated by a certain distance. A portion of the first active layer 113 between the first source electrode and the first drain electrode may define a channel.

For example, when a proper voltage is applied on the gate electrode 111 to switch on the displaying transistor T1, the display-region gate electrode insulating layer 112 may be considered as the dielectric layer in a capacitor, thus negative charges may be induced on the channel. The negative charges may create an electron flow from the first source electrode to the first drain electrode to make the channel conductive. When an opposite voltage is applied on the gate electrode 111, electrons may be depleted in the channel, thus almost no current is formed, and the displaying transistor T1 may be switched off.

In the disclosed embodiments, the displaying transistor T1 may be a metal-oxide semiconductor transistor, in which the first active layer 113 in the displaying transistor T1 may be a metal-oxide semiconductor layer. The material of the metal-oxide semiconductor layer may include any one of indium gallium zinc oxide (IGZO), indium tin zinc oxide material (ITZO), indium gallium tin oxide (IGTO), indium tin oxide (ITO) and indium zinc oxide (IZO) or corresponding complexes with different ratios.

The driving transistor T2 may be a thin film transistor (TFT) having a bottom gate electrode and a top gate electrode, i.e., a double-gate TFT. The driving transistor T2 may include a bottom gate electrode 121, a non-display-region gate electrode insulating layer 122, a second active layer 123, a second source electrode (a second drain electrode) 124, a non-display-region passivation layer 125, and a top gate electrode 126.

The bottom gate electrode 121 may be first disposed on the base substrate 110, the non-display-region gate electrode insulating layer 122 may be disposed on the bottom gate electrode 121, and the second active layer 123 may be disposed on a side of the non-display-region gate electrode insulating layer 122 away from the base substrate 110. That is, the bottom gate electrode 121, the non-display-region gate electrode insulating layer 122 and the second active layer 123 may be sequentially disposed on the base substrate 110.

The second source electrode (the second drain electrode) 124 may be disposed on a side of the non-display-region gate electrode insulating layer 122 away from the base substrate 110 and a side of the second active layer 123 away from the base substrate 110. For example, as shown in FIG. 3, the second source electrode (the second drain electrode) 124 may partially contact the surface of the non-display-region gate electrode insulating layer 122 away from the base substrate 110, and partially contact the surface of the second active layer 123 away from the base substrate 110.

The non-display-region passivation layer 125 may be disposed on a side of the second active layer 123 away from the base substrate 110 and a side of the second source electrode (the second drain electrode) 124 away from the base substrate 110. For example, as shown in FIG. 3, the non-display-region passivation layer 125 may partially contact the surface of the second active layer 123 away from the base substrate 110, and partially contact the surface of the second source electrode (the second drain electrode) 124 away from the base substrate 110. The top gate electrode 126 may be disposed on a side of the non-display-region passivation layer 125 away from the base substrate 110.

The second active layer 123 may be disposed between the non-display-region gate electrode insulating layer 122 and the second source electrode (the second drain electrode) 124. The non-display-region passivation layer 125 may be disposed between the source electrode (the second drain electrode) 124 and the top gate electrode 126, and the position of the top gate electrode 126 may correspond to the position of the bottom gate electrode 122.

The second source electrode (second drain electrode) 124 may be formed on the second active layer 123 and, meanwhile, the second source electrode and the second drain electrode may be arranged opposite to each other and separated by a certain distance. A portion of the second active layer 123 between the second source electrode and the second drain electrode may define a channel.

In the disclosed embodiments, the divining transistor T2 may be a metal-oxide-semiconductor transistor, in which the second active layer 123 may be a metal-oxide semiconductor layer. The material of the metal-oxide semiconductor layer may include any one of indium gallium zinc oxide (IGZO), indium tin zinc oxide material (ITZO), indium gallium tin oxide (IGTO), indium tin oxide (ITO) and indium zinc oxide (IZO) or corresponding complexes with different ratios.

In the disclosed embodiments, the array substrate 10 may have a feature that the display region 11 and the non-display region 12 may be integrated into a same fabrication process. For example, the driving transistors T2 in the peripheral driving circuit of the non-display region 12 and the displaying transistors T1 in the display region 11 may be fabricated at the same time. In particular, the bottom gate electrode 121 of the driving transistor T2 and the gate electrode 111 of the displaying transistor T1 may be formed at the same layer and by the same material, and the top gate electrode 126 of the driving transistor T2 and the touch leading wire 116 in the display region 11 may be formed at the same layer and by the same material.

The material of the touch leading wire 116 and the gate electrode 126 may be any one or an alloy of opaque metals with a good electrical conductivity, such as molybdenum, copper, aluminum, silver, titanium, nickel, niobium, neodymium, tantalum and chromium, etc. On one hand, the touch leading wire 116 may have an improved signal transmission performance and, meanwhile, touch signal weakening, which may result from a large wiring resistance, may have less influence on the touch performance. Thus, touches or touch signals, for example, from fingertip, fingernail, stylus, may be easier to be detected on the array substrate.

On the other hand, using opaque metals as the top gate electrode to cover the metal-oxide semiconductor channel (i.e., the portion of the second active layer between the second source electrode and the second drain electrode) may reduce the photocurrent and eliminate the influence of light irradiation on the stability of metal-oxide semiconductor devices.

Further, because the top gate electrode 126 and the touch leading wire 116 may be formed at the same layer, double-gate metal-oxide semiconductor transistors (i.e., the driving transistors T2) may be formed at the peripheral driving circuit without additional photomasks and additional supporting techniques, and the threshold voltage of the metal-oxide semiconductor may get controlled. Thus, the fabrication cost may not be increased while the reliability of the peripheral driving circuit may be improved.

Further, the second active layer 123 and the first active layer 113 of the display region 11 may be formed at the same layer and by the same material, and the second active layer 123 and the first active layer 113 may be metal-oxide semiconductor layers. The second source electrode (second drain electrode) 124 and the first source electrode (first drain electrode) 114 may also be formed at the same layer and by the same material.

Further, the non-display-region gate electrode insulating layer 122 and the display-region gate electrode insulating layer 112 in the display region 11 may be formed at the same layer and by the same material. The non-display-region gate electrode insulating layer 122 and the display-region gate electrode insulating layer 112 may include one or more of a silicon oxide film, a silicon nitride film, a silicon nitride oxide film, an aluminum oxide film or a titanium oxide film. In the disclosed embodiments, in addition to silicon oxide film, silicon nitride film, silicon nitride oxide film, aluminum oxide film or titanium oxide film, the display-region gate electrode insulating layer 112 and the non-display-region gate electrode insulating layer 122 may also be films formed by other inorganic insulating materials which have a same or similar property as the above-mentioned films.

If the display-region gate electrode insulating layer 112 and the non-display-region gate electrode insulating layer 122 are too thin, hydrogen-containing groups may still affect the metal-oxide semiconductor layer (i.e., the first active layer and the second active layer). For example, positive charges may be trapped in the active layer and negative threshold voltage of the metal-oxide TFT may be shifted. If the display-region gate electrode insulating layer 112 and the non-display-region gate electrode insulating layer 122 are too thick, the film formation of the display-region gate electrode insulating layer 112 and the non-display-region gate electrode insulating layer 122 may require a longer time, thus the fabrication efficiency may be reduced.

In certain embodiments, the display-region gate electrode insulating layer 112 and the non-display-region gate electrode insulating layer 122 may have a thickness of approximately 100 nm~300 nm, respectively. Thus, the influence of the hydrogen-containing groups on the metal-oxide semiconductors and the time to form the two insulating layers (i.e., the display-region gate electrode insulating layer 112 and the non-display-region gate electrode insulating layer 122) may get balanced.

Given an effective elimination of the influence of the hydrogen-containing groups on the metal-oxide semiconductors, for example, the negative threshold voltage of the metal-oxide TFT may be only shifted within a preset value, the two insulating layers (i.e., the display-region gate electrode insulating layer 112 and the non-display-region gate electrode insulating layer 122) may be formed within the shortest time and the fabrication efficiency may be improved. The preset value may be determined by the performance requirement of the metal-oxide TFT.

Further, the non-display-region passivation layer 125 and the display-region passivation layer 115 may be formed at the same layer and by the same material. The passivation layer may a layer including any one of silicon oxide and silicon nitride, or may be a composite layer including both silicon oxide and silicon nitride.

In the disclosed embodiments, to control the threshold voltage of the metal-oxide semiconductor transistor through the top gate electrode 126, an appropriate voltage may have to be applied to the top gate electrode 126. For example, a same voltage may be applied to the top gate electrode 126 and the bottom gate electrode 121. The top gate electrode 126 may be electrically connected to the bottom gate electrode 121 through a signal line, or the top gate electrode 126 and the bottom gate electrode 121 may be electrically connected to the driving IC, respectively, and the driving IC may provide the same voltage to the top gate electrode 126 and the bottom gate electrode 121, respectively.

In another embodiment, different voltages may be applied to the top gate electrode 126 and the bottom gate electrode 121, in which the top gate electrode 126 and the bottom gate electrode 121 may be electrically connected to the driving IC, respectively, and the driving IC may provide different voltages to the top gate electrode 126 and the bottom gate electrode 121, respectively. Thus, the threshold voltage of the driving transistors may be controlled.

Figure 4:
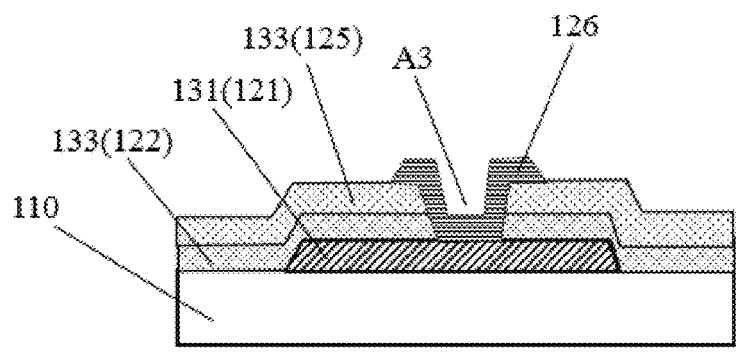
FIG. 4 illustrates a cross-sectional view of an exemplary non-display region in an exemplary array substrate in FIG. 3 consistent with disclosed embodiments.

FIG. 4 illustrates a cross-sectional view of an exemplary non-display region in an exemplary array substrate in FIG. 3 consistent with disclosed embodiments. As shown in FIG. 4, the non-display region in the array substrate may further include an electrical connection structure. The electrical connection structure may include a first wiring 131, an insulating interlayer 133 and the top gate electrode 126. The first wiring 131 may be disposed on the base substrate 110, the insulating interlayer 133 may be disposed on a side of the first wiring 131 away from the base substrate 110, and the top gate electrode 126 may be disposed on a side of the insulating interlayer 133 away from the base substrate 110.

The insulating interlayer 133 may include the non-display-region gate electrode insulating layer 122 and the non-display-region passivation layer 125. The top gate electrode 126 may be electrically connected to the first wiring 131 through a third through hole A3 penetrating the insulating interlayer 133. In particular, the first wiring 131 and the bottom gate electrode 121 may be formed at the same layer and by the same material. The top gate electrode 126 may be electrically connected to the bottom gate electrode 121 through the first wiring 131, or the top gate electrode 126 may be electrically connected to the driving IC through the first wiring 131, providing an appropriate driving voltage to the top gate electrode 126.

Figure 5:
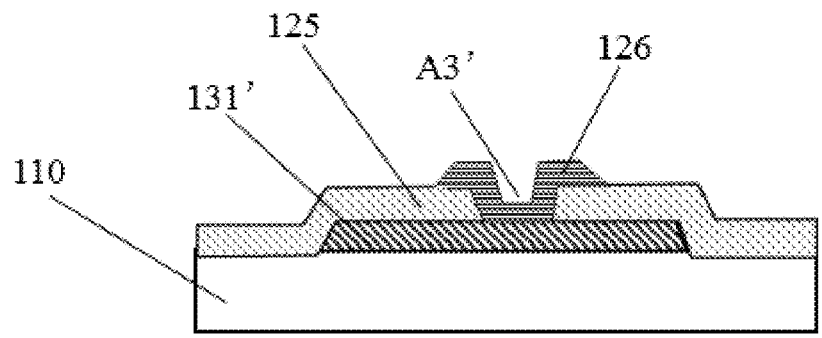
FIG. 5 illustrates a cross-sectional view of another exemplary non-display region in an exemplary array substrate in FIG. 3 consistent with disclosed embodiments.

FIG. 5 illustrates a cross-sectional view of another exemplary non-display region in an exemplary array substrate in FIG. 3 consistent with disclosed embodiments. As shown in FIG. 5, the non-display region in the array substrate may further include an electrical connection structure. The electrical connection structure may include a first wiring 131', the non-display-region passivation layer 125, and the top gate electrode 126. The first wiring 131' may be disposed on the base substrate 110, the non-display-region passivation layer 125 may be disposed on a side of the first wiring 131' away from the base substrate 110, and the top gate electrode 126 may be disposed on a side of the non-display-region passivation layer 125 away from the base substrate 110.

The top gate electrode 126 may be electrically connected to the first wiring 131' through a third through hole A3' penetrating the non-display-region passivation layer 125. In particular, the first wiring 131' and the second source electrode (the second drain electrode) 124 may be formed at the same layer and by the same material. The top gate electrode 126 may be electrically connected to the bottom gate electrode 121 through the first wiring 131', or the top gate electrode 126 may be electrically connected to the driving IC through the first wiring 131', providing an appropriate driving voltage to the top gate electrode 126.

Figure 6:
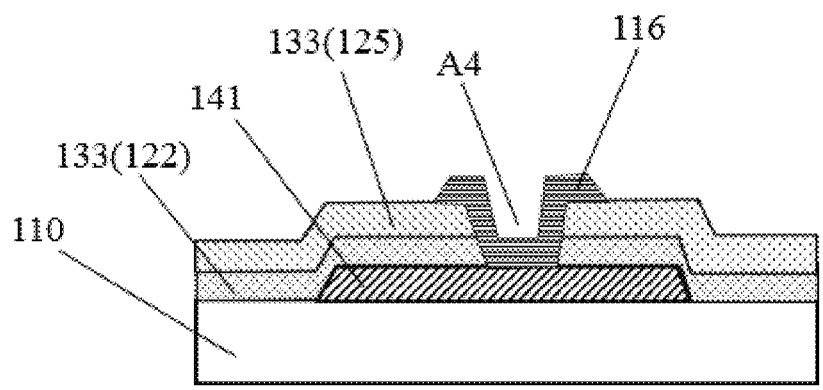
FIG. 6 illustrates a cross-sectional view of another exemplary non-display region in an exemplary array substrate in FIG. 3 consistent with disclosed embodiments.

FIG. 6 illustrates a cross-sectional view of another exemplary non-display region in an exemplary array substrate in FIG. 3 consistent with disclosed embodiments. As shown in FIG. 6, the non-display region in the array substrate may further include an electrical connection structure. The electrical connection structure may include a second wiring 141, the insulating interlayer 133, the touch leading wire 116 and the non-display-region passivation layer 125. The second wiring 141 may be disposed on the base substrate 110, the insulating interlayer 133 may be disposed on a side of the second wiring 141 away from the base substrate 110, and the touch leading wire 116 may be disposed on a side of the insulating interlayer 133 away from the base substrate 110.

The insulating interlayer 133 may include the non-display-region gate electrode insulating layer 122 and the non-display-region passivation layer 125. The touch leading wire 116 may be electrically connected to the second wiring 141 through a fourth through hole A4 penetrating the insulating interlayer 133. In particular, the second wiring 141 and the bottom gate electrode 121 may be formed at the same layer and by the same material. The touch leading wire 116 may be electrically connected to the driving IC through the second wiring 141, providing an appropriate touch signal to the touch electrode block 119a.

In the disclosed embodiment, the second wiring 141 and the bottom gate electrode 121 may be formed at the same layer and by the same material. Thus, the second wiring 141 and the bottom gate electrode 121 may be formed through a same photomask at the same time, reducing the steps of the fabrication process and the fabrication cost. On the other hand, a multi-layer and cross-layer wiring design in the non-display region may be avoided, simplifying the wiring design in the non-display region and improving the production yield.

Figure 7:
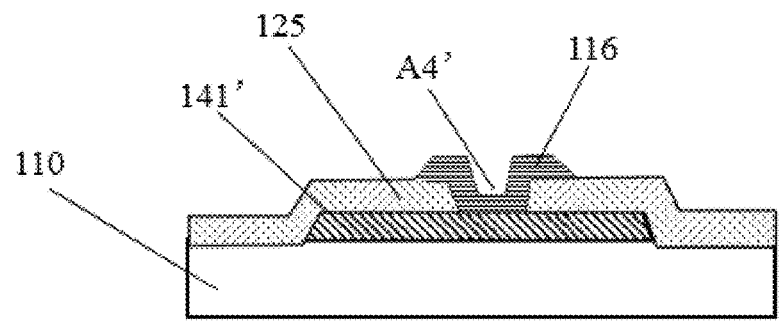
FIG. 7 illustrates a cross-sectional view of another exemplary non-display region in an exemplary array substrate in FIG. 3 consistent with disclosed embodiments.

FIG. 7 illustrates a cross-sectional view of another exemplary non-display region in an exemplary array substrate in FIG. 3 consistent with disclosed embodiments. As shown in FIG. 7, the non-display region in the array substrate may further include an electrical connection structure. The electrical connection structure may include a second wiring 141', the non-display-region passivation layer 125, and the touch leading wire 116. The second wiring 141' may be disposed on the base substrate 110, the non-display-region passivation layer 125 may be disposed on a side of the second wiring 141' away from the base substrate 110, and the touch leading wire 116 may be disposed on a side of the non-display-region passivation layer 125 away from the base substrate 110.

The touch leading wire 116 may be electrically connected to the second wiring 141' through a fourth through hole A4' penetrating the non-display-region passivation layer 125. In particular, the second wiring 141' and the second source electrode (the second drain electrode) 124 may be formed at the same layer and by the same material. The touch leading wire 116 may be electrically connected to the driving IC through the second wiring 141', providing an appropriate touch signal to the touch electrode block 119a.

In the disclosed embodiment, the second wiring 141' and the second source electrode (the second drain electrode) 124 may be formed at the same layer and by the same material. Thus, the second wiring 141' and the second source electrode (the second drain electrode) 124 may be formed through a same photomask at the same time, reducing the steps of the fabrication process and the fabrication cost. On the other hand, a multi-layer and cross-layer wiring design in the non-display region may be avoided, simplifying the wiring design in the non-display region and improving the production yield.

In the disclosed embodiments, the driving transistors in the peripheral driving circuit of the non-display region may be double-gate metal-oxide semiconductor transistors, in which the top gate electrode of the double-gate metal-oxide semiconductor transistor and the touch leading wire in the display region may be formed at the same layer and by the same material. The material of the gate electrode may be any one or an alloy of opaque metals with a good electrical conductivity, such as molybdenum, copper, aluminum, silver, titanium, nickel, niobium, neodymium, tantalum and chromium, etc.

On one hand, the double-gate metal-oxide semiconductor transistors (i.e., the driving transistors) may be formed at the peripheral driving circuit without additional photomasks and fabrication techniques, and the threshold voltage of the metal-oxide semiconductor transistors may get controlled. Thus, the fabrication cost may not be increased while the reliability of the peripheral driving circuit may be improved. On the other hand, using opaque metals as the top gate electrode to cover the semi-conductor channel (i.e., the portion of the second active layer between the second source electrode and the second drain electrode) may reduce the photocurrent and eliminate the influence of light irradiation on the stability of metal-oxide semiconductor devices.

Figure 8A:
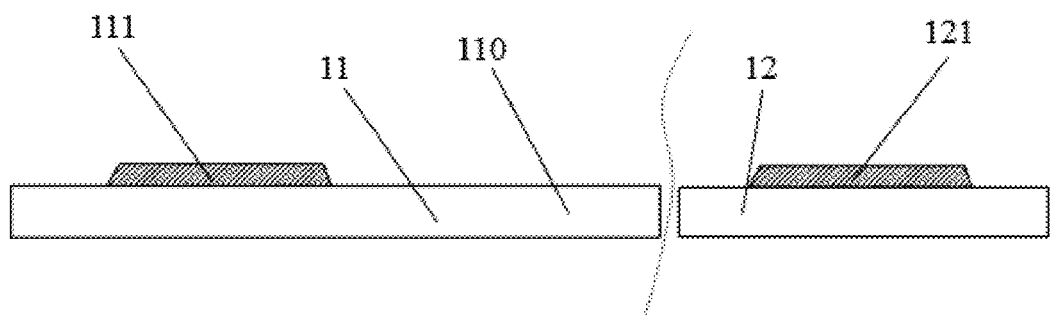
FIGS. 8a-8g illustrate cross-sectional views of an exemplary array substrate during certain stages of the fabrication process in FIG. 9 consistent with disclosed embodiments.
Figure 8B:
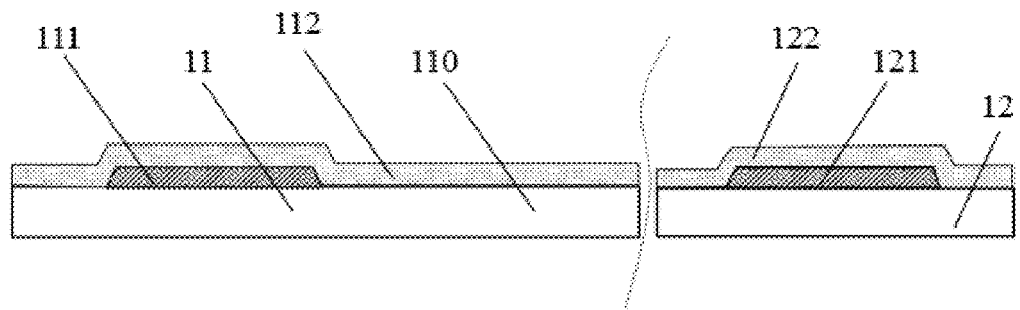
Figure 8C:
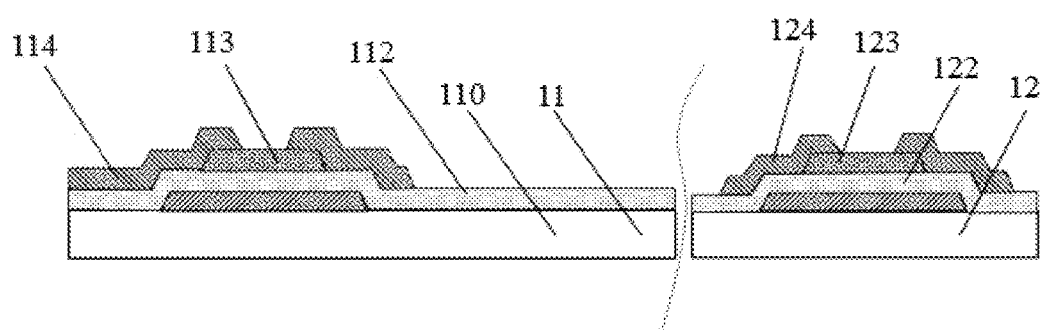
Figure 8D:
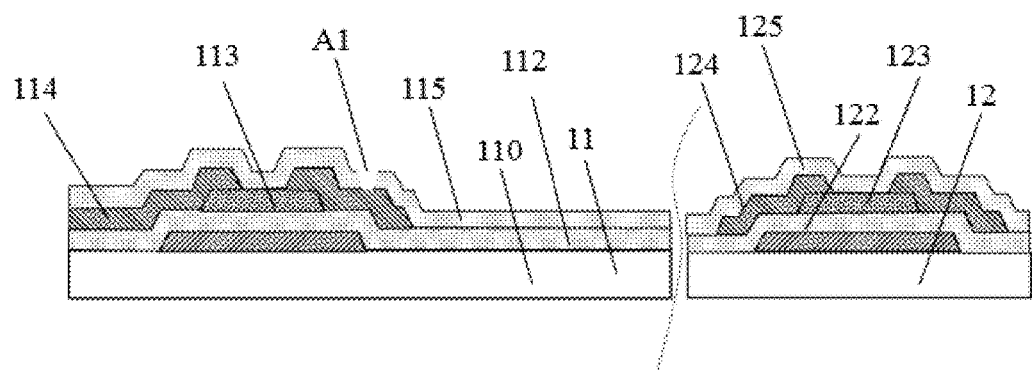
Figure 8E:
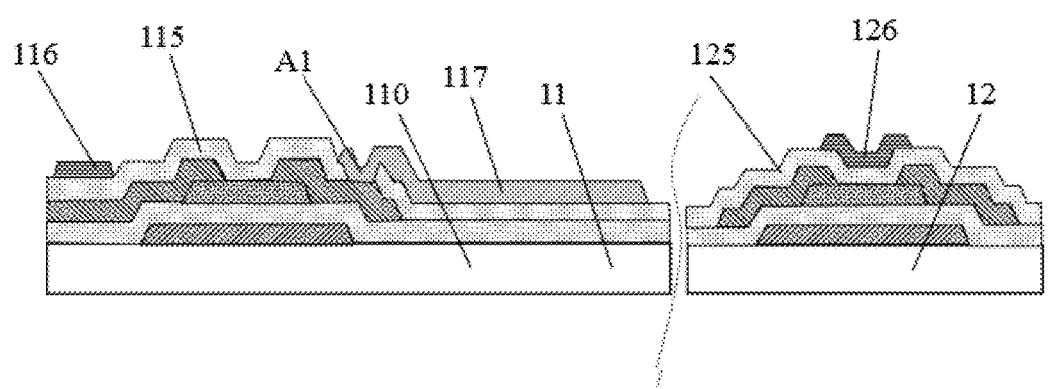
Figure 8F:
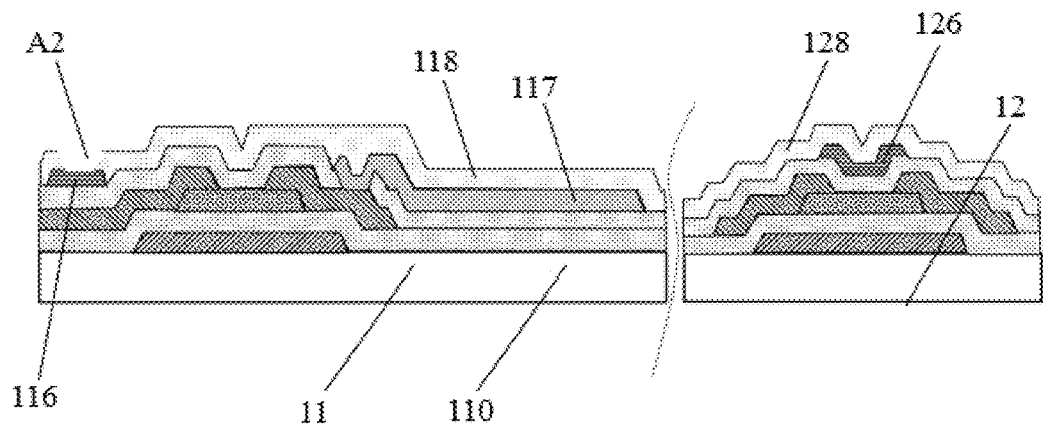
Figure 8G:
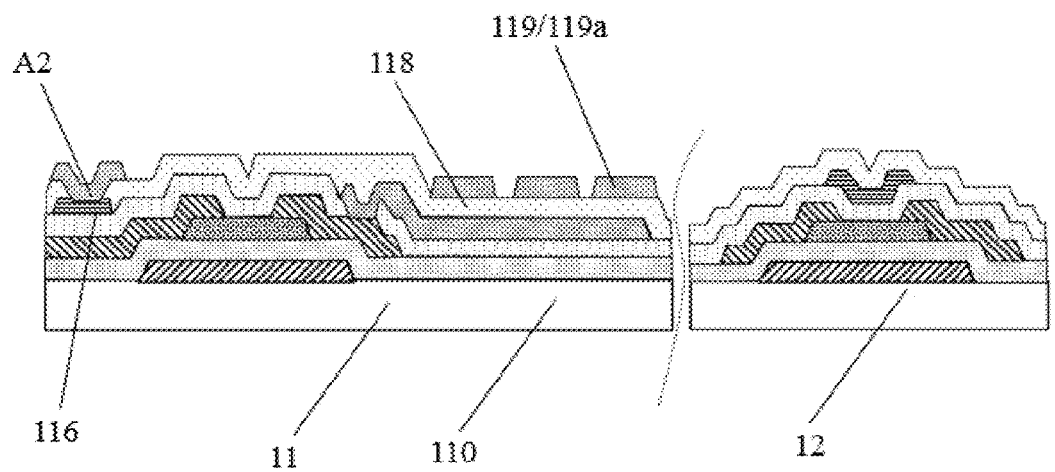
Figure 9:
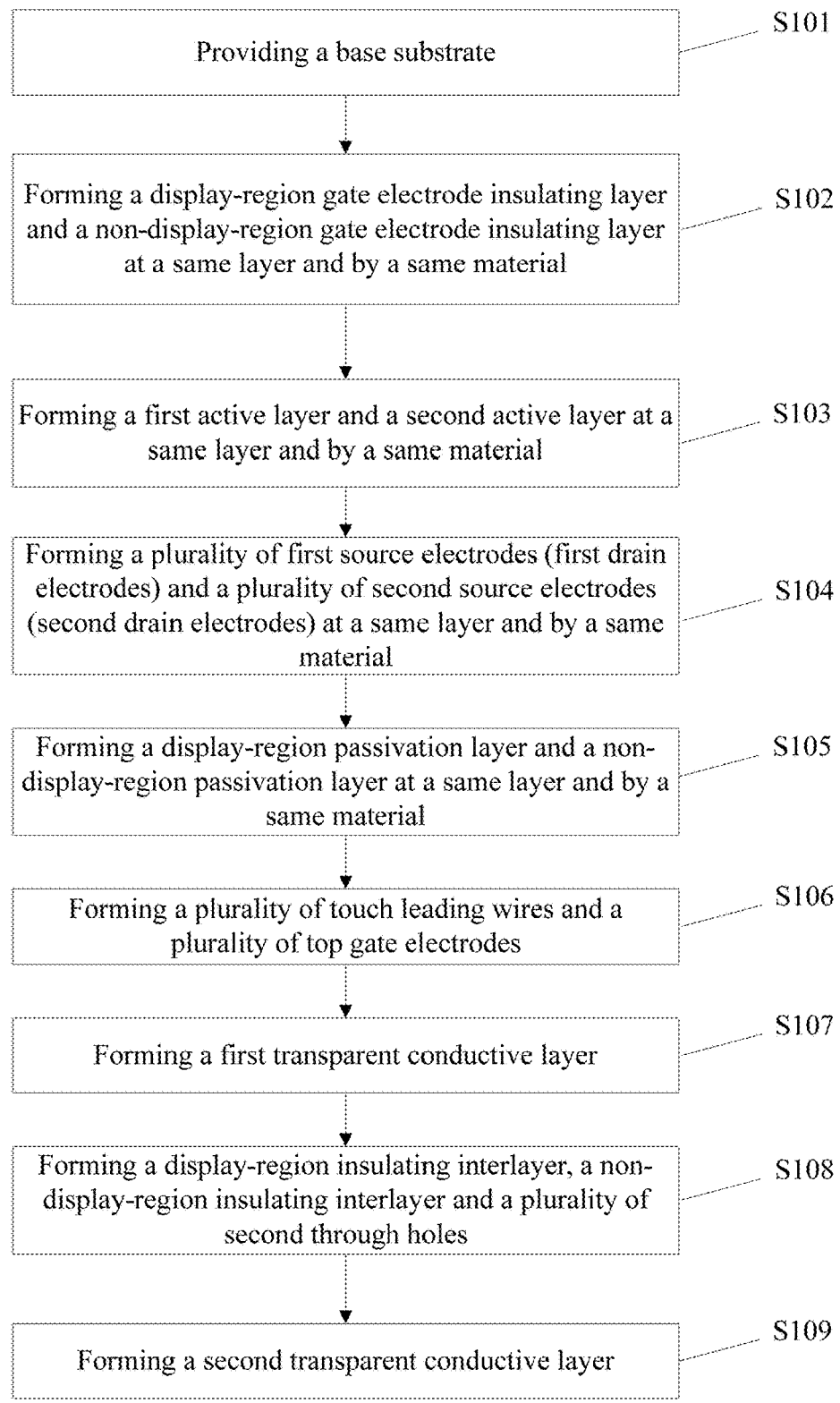
FIG. 9 illustrates a flow chart of an exemplary fabrication process of an exemplary array substrate consistent with disclosed embodiments.

The present disclose further provide a fabrication method of the disclosed array substrates. FIG. 9 illustrates a flow chart of an exemplary fabrication process of an exemplary array substrate consistent with disclosed embodiments. FIGS. 8a-8g illustrate cross-sectional views of an exemplary array substrate during certain stages of the fabrication process in FIG. 9 consistent with disclosed embodiments. As shown in FIG. 9, the fabrication method may include the following steps.

At the beginning, a base substrate is provided (S101). FIG. 8a illustrates a cross-sectional view of a corresponding structure.

As shown in FIG. 8a, a base substrate 110 may be provided. The base substrate 110 may include the display region 11 and the non-display region 12. A plurality of gate electrodes 111 and gate lines (not drawn in FIG. 8a) may be formed at the display region 11 of the base substrate 110 and, meanwhile, a plurality of bottom gate electrode 121 may be formed at the non-display region 12 of the base substrate 110. The gate electrode 111 and the bottom gate electrode 121 may be formed at the same layer and by the same material.

For example, the base substrate 110 may be a glass substrate, and a metal layer may be formed on the glass substrate through magnetron sputtering. The material of the metal layer may be any one or an alloy of opaque metals with a good electrical conductivity, such as molybdenum, copper, and aluminum, etc., and the thickness of the metal layer may be approximately 200 nm-350 nm. Thus, the metal layer may keep a relatively low sheet resistance. Then, the metal layer may be patterned through wet etching, and the gate electrodes 111 and gate lines (not drawn in FIG. 8a) may be formed at the display region 11 of the base substrate 110 and, meanwhile, the bottom gate electrodes 121 may also be formed at the non-display region 12 of the base substrate 110.

Returning to FIG. 9, after the base substrate is provided, a display-region gate electrode insulating layer is formed on the display region having the gate electrodes, and a non-display-region gate electrode insulating layer is formed on the non-display region having the bottom gate electrodes, in particular, the non-display-region gate electrode insulating layer and the display-region gate electrode insulating layer are formed at the same layer and by the same material (S102). FIG. 8b illustrates a cross-sectional view of a corresponding structure.

As shown in FIG. 8b, after the base substrate 110 is provided, the display-region gate electrode insulating layer 112 may be formed on the display region 11 having the gate electrodes 111. The non-display-region gate electrode insulating layer 122 may be formed on the non-display region 12 having the bottom gate electrodes 121.

For example, the display-region gate electrode insulating layer 112 may partially contact the display region 11 and partially contact the gate electrode 111, the non-display-region gate electrode insulating layer 122 may partially contact the non-display region 12 and partially contact the bottom gate electrode 121.

In particular, the non-display-region gate electrode insulating layer 122 and the display-region gate electrode insulating layer 112 may be formed at the same layer and by the same material. For example, the non-display-region gate electrode insulating layer 122 and the display-region gate electrode insulating layer 112 may be formed by silicon dioxide film, silicon nitride, silicon oxynitride, aluminum oxide, titanium oxide or other inorganic insulating materials.

The thickness of the non-display-region gate electrode insulating layer 122 and the display-region gate electrode insulating layer 112 may be approximately 100 nm~300 nm. Thus, the influence of the hydrogen-containing groups on the metal-oxide semiconductors and the time to form the two insulating layers (i.e., the display-region gate electrode insulating layer 112 and the non-display-region gate electrode insulating layer 122) may get balanced.

Given an effective elimination of the influence of the hydrogen-containing groups on the metal-oxide semiconductors, for example, the negative threshold voltage of the metal-oxide TFT may be only shifted within a preset value, the two insulating layers (i.e., the display-region gate electrode insulating layer 112 and the non-display-region gate electrode insulating layer 122) may be formed within the shortest time and the fabrication efficiency may be improved. The preset value may be determined by the performance requirement of the metal-oxide TFT.

Further, the non-display-region gate electrode insulating layer 122 and the display-region gate electrode insulating layer 112 may be under an annealing process, in which a high-temperature annealing furnace may be adopted to dehydrogenize the non-display-region gate electrode insulating layer 122 and the display-region gate electrode insulating layer 112. For example, in the annealing process, the non-display-region gate electrode insulating layer 122 and the display-region gate electrode insulating layer 112 may be protected by nitrogen, vacuum, or a noble gas, the annealing temperature may be approximately 250° C.~450° C., and the annealing time may be approximately 20 mins~150 mins.

In another embodiment, the annealing process may introduce a vacuum heating chamber to the PECVD (Plasma Enhanced Chemical Vapor Deposition) device to dehydrogenize the non-display-region gate electrode insulating layer 122 and the display-region gate electrode insulating layer 112. The vacuum heating chamber may have a pressure of approximately $10^{-4}$ Pa~1 Pa. For example, the temperature of the annealing chamber (i.e., vacuum heating chamber) may be approximately 350° C.~480° C., the annealing time may be approximately 10 mins~30 mins. Compared with traditional annealing process, annealing process involving the high-temperature annealing furnace or the vacuum heating chamber may shorten the time of annealing process, improve the product yield and reduce the equipment cost.

Returning to FIG. 9, after the display-region gate electrode insulating layer and the non-display-region gate electrode insulating layer are formed, a first active layer is formed on the display region having the display-region gate electrode insulating layer, and a second active layer is formed on the non-display region having the non-display-region gate electrode insulating layer, and the first active layer and the second active layer are formed at the same layer and by the same material (S103). FIG. 8c illustrates a cross-sectional view of a corresponding structure.

As shown in FIG. 8c, the first active layer 113 may be formed on the display region 11 having the display-region gate electrode insulating layer 112, and the second active layer 123 may be formed on the non-display region 12 having the non-display-region gate electrode insulating layer 122. Further, the first active layer and the second active layer may be formed at the same layer and by the same material.

In the disclosed embodiments, firstly, a metal-oxide semiconductor layer may be formed by magnetron sputtering, a solution method, etc. The metal-oxide semiconductor materials for the metal-oxide semiconductor layer may be any one of indium gallium zinc oxide (IGZO), indium tin zinc oxide material (ITZO), indium gallium tin oxide (IGTO), indium tin oxide (ITO) and indium zinc oxide (IZO) or related complexes with different ratios. Then, the metal-oxide semiconductor layer may be patterned to form the first active layer 113 in the display region 11 and the second active layer 123 in the non-display region 12. Two methods may be adopted in the patterning process of the metal-oxide semiconductor layer: wet etching and dry etching. Different etching methods may cause different damages to the metal-oxide semiconductor layer, choosing an appropriate patterning process may play an import role in improving the characteristics of the metal-oxide TFT.

Further, an etch-stop layer (not drawn in FIG. 8c) may be formed on the first active layer 113 and the second active layer 123. The material of the etch-stop layer may often be SiOx, SiNx, SiOxNy, Al2O3, TiOx and other inorganic insulating materials. The etch-stop layer may reduce the damage to the metal-oxide semiconductor layer in the following process of patterning data lines. After an etch-stop film is formed on the metal-oxide semiconductor layer, the etch-stop film may be patterned. The dry etching method may often be used to pattern the etch-stop film to form the etch-stop layer.

Returning to FIG. 9, after the first active layer and the second active layer are formed, a plurality of first source electrode (first drain electrode) is formed on the display region having the first active layer, a plurality of second source electrode (second drain electrode) and a plurality of data lines are formed on the non-display region having the second active layer, and the first source electrodes (first drain electrodes), the second source electrodes (second drain electrodes) and the data lines are formed in the same layer and by the same material (S104). FIG. 8c illustrates a cross-sectional view of a corresponding structure.

As shown in FIG. 8c, after the first active layer and the second active layer are formed, the plurality of first source electrode (first drain electrode) 114 may be formed on the display region 11 having the first active layer 113. For example, the first source electrode (the first drain electrode) 114 may partially contact the display-region gate electrode insulating layer 112, and partially contact the first active layer 113, and the second source electrode (second drain electrode) 124 and the data lines (not drawn in FIG. 8d) may partially contact the non-display-region gate electrode insulating layer 122 and partially contact the second active layer 123. The first source electrode (first drain electrode) 114, the second source electrode (second drain electrode) 124 and the data lines may be formed in the same layer and by the same material.

In particular, after forming the etch stop layer, the first source electrodes (first drains) 114, the second source electrodes (second drain electrodes) 124 and the data lines (not drawn in FIG. 8d) may be formed. Firstly, a layer of metal (i.e., a metal layer) may be deposited on the base substrate 110 having the first active layer 113 and the second active layer substrate 123, and then the metal layer may be patterned through the wet etching method, forming the plurality of first source electrode (first drain) 114, the plurality of second source electrode (second drain electrode) 124 and the plurality of data lines (not drawn in FIG. 8d).

Returning to FIG. 9, after the first source electrodes (first drain electrodes), the second source electrodes (second drain electrodes) and the data lines are formed, a display-region passivation layer is formed on the display region having the first source electrodes (first drain electrodes), a non-display-region passivation layer is formed on the non-display region having the second source electrodes (second drain electrodes), and the display-region passivation layer and the non-display-region passivation layer are formed at the same layer and by the same material (S105). FIG. 8d illustrates a cross-sectional view of a corresponding structure.

As shown in FIG. 8d, the display-region passivation layer 115 may be formed on the display region 11 having the first source electrodes (first drain electrodes) 144, and the non-display-region passivation layer 125 may also be formed on the non-display region having the second source electrodes (second drain electrodes). Further, the display-region passivation layer 115 and the non-display-region passivation layer 125 may be formed at the same layer and by the same material.

For example, the display-region passivation layer 115 may partially contact the first second active layer 113, partially contact the first source electrodes (the first drain electrodes) 114 and partially contact the display-region gate electrode insulating layer 112. The non-display-region passivation layer 125 may partially contact the second active layer 123, and partially contact the second source electrodes (the second drain electrodes) 124.

In particular, after forming the first source electrodes (first drain electrodes) 114 and the second source electrode (second drain electrodes) 124, a passivation layer may be deposited on the based substrate 110. The material of the passivation layer may be SiOx, SiNx, SiOxNy, Al2O3, TiOx or other inorganic insulating materials. Thus, the display-region passivation layer 115 may be formed on the display region 11 and, meanwhile, the non-display-region passivation layer 125 may be formed the non-display region 12.

Further, the formed display-region passivation layer 115 may be etched to have a plurality of through hole, i.e., a plurality of first through holes A1, which may enable an electrical connection between the first source electrode (first drain) 114 and the pixel electrode formed in the following process. The position of the first through hole A1 may correspond to the position of the first source electrode (first drain) 114.

Returning to FIG. 9, after the display-region passivation layer and the non-display-region passivation layer are formed, a plurality of touch leading wires and a plurality of top gate electrodes are formed on the base substrate (S106). FIG. 8e illustrates a cross-sectional view of a corresponding structure.

As shown in FIG. 8e, the plurality of touch leading wires 116 and the plurality of top gate electrodes 126 may be formed on the base substrate 110 having the display-region passivation layer 115 and the non-display-region passivation layer 125.

In particular, firstly, a light-shieling metal layer may be formed on the base substrate 110 having the display-region passivation layer 115 and the non-display-region passivation layer 125. The light-shieling metal layer may often be formed by the magnetron sputtering, and the material of the light-shieling metal layer may be copper (Cu) or copper alloys. Thus, the light-shieling metal layer may have a relative small sheet resistance. Then, the light-shieling metal layer may be patterned by the wet etching to form the plurality of touch leading wires 116 and the plurality of top gate electrodes 126 of the driving transistors T2. The top gate electrode 126 may be disposed on top of the second active layer 123 of the driving transistor T2, and the position of the top gate electrode 126 may correspond to the position of the bottom gate electrode 121. Further, in addition to copper (Cu) or copper alloys, the material of the light-shieling metal layer may also be any one or an alloy of molybdenum, copper, aluminum, silver, titanium, nickel, niobium, neodymium, tantalum, and chromium, etc.

Returning to FIG. 9, after the touch leading wires and the top gate electrodes are formed, a first transparent conductive layer is formed on the base substrate (S107).

The first transparent conductive layer (not shown) may be formed on the base substrate 110 having the touch leading wires 116 and the top gate electrodes 126. In particular, the first transparent conductive layer (not shown) may be formed on the display-region passivation layer 115 through a coating process. In the disclosed embodiments, the first transparent conductive layer may form a plurality of pixel electrode 117 through a patterning process, and the pixel electrode 117 may partially fill the first through hole A1 to be electrically connected to the first source electrode (or a first drain) 114. The patterning process may include photoresist coating, exposure, development, etching and photoresist removing, etc.

Returning to FIG. 9, after first transparent conductive layer is formed, a display-region insulating interlayer, a non-display-region insulating interlayer and a plurality of second through holes are formed on the base substrate having the first transparent conductive layer (S108). FIG. 8*f* illustrates a cross-sectional view of a corresponding structure.

As shown in FIG. 8*f*, the display-region insulating interlayer 118, the non-display-region insulating interlayer 128, and the plurality of second through holes A2 may be formed on the base substrate 110 having the first transparent conductive layer.

In particular, the display-region insulating interlayer 118 may be formed on top of the first transparent conductive layer in the display region 11 and, meanwhile, the non-display-region insulating interlayer 128 may be formed on top of the driving transistor in the non-display region 12. The display-region insulating interlayer 118 and the non-display-region insulating interlayer 128 may be formed at the same time. To be more specific, the insulating layer may be coated on the first transparent conductive layer in the display region 11 and the driving transistor in the non-display region 12. The insulating layer may be an inorganic film, for example, the material may be silicon nitride or silicon dioxide.

Further, the second through holes A2 may be formed in the display-region insulating interlayer 118 through a patterning process, and the second through holes A2 may penetrate the display-region insulating interlayer 118 and may be disposed on top of the touch leading wires 116. The patterning process may include photoresist coating, exposure, development, etching and photoresist removing, etc.

Returning to FIG. 9, after the display-region insulating layer, the non-display-region insulating interlayer and the second through hole are formed, a second transparent conductive layer is formed on the display region having the display-region insulating layer (S109). FIG. 8*g* illustrates a cross-sectional view of a corresponding structure.

As shown in FIG. 8*g*, the second transparent conductive layer may be formed on the display region 11 having the display-region insulating interlayer 118. In particular, the second transparent conductive layer may be formed on the display-region insulating interlayer 118 through a coating process. In the disclosed embodiments, the second transparent conductive may form the common electrode 119 through a patterning process and, meanwhile, the common electrode 119 may be divided into the plurality of touch electrode blocks 119*a*. The common electrode 119 may completely fill the second through-hole A2, such that each touch electrode block 119*a* may be electrically connected to the corresponding touch leading wire 116. The patterning process may include photoresist coating, exposure, development, etching and photoresist removing, etc.

It should be noted that, the multiplexing of the common electrode blocks and the touch electrode blocks may reduce the thickness of the touch display panel and, meanwhile, the fabrication may only involve one etching process. Thus, the steps of the fabrication process may be reduced and the fabrication efficiency may be improved.

In another embodiment, the touch electrode blocks on the array substrate may be only used as the electrodes for touching, and the common electrode and the touch electrode blocks may be disposed in the same layer or different layers, which are not intended to limit the scope of the present invention.

In another embodiment, to fabricate the array substrate having a display region shown in FIG. 3 and a non-display region shown in the FIG. 4, the fabrication step S101 may also include forming a plurality of first wirings 131 on the non-display region 12, in which the plurality of first wirings 131 and the plurality of bottom gate electrodes 121 may be formed at the same layer and by the same material.

Further, the fabrication step S108 may also include forming a plurality of third through holes A3 in the non-display-region gate electrode insulating layer 122 and the non-display-region passivation layer 125, such that the top gate electrode 126 may be electrically connected to the first wiring 131 through the third through hole A3. In particular, the first wiring 131 may be electrically connected the bottom gate electrode 121, or the first wiring 131 and the bottom gate electrode 121 may be electrically connected to the driving IC, respectively.

In another embodiment, to fabricate the array substrate having a display region shown in FIG. 3 and a non-display region shown in the FIG. 5, the fabrication step S104 may also include forming a plurality of first wiring 131' on the non-display region 12, in which the plurality of first wiring 131' and the plurality of second source electrodes (the second drain electrodes) 124 may be formed at the same layer and by the same material.

Further, the fabrication step S108 may also include forming a plurality of third through holes A3' in the non-display-region passivation layer 125, such that the top gate electrode 126 may be electrically connected to the first wiring 131' through the third through hole A3'. In particular, the first wiring 131' may be electrically connected the bottom gate electrode 121, or the first wiring 131' and the bottom gate electrode 121 may be electrically connected to the driving IC, respectively.

In another embodiment, to fabricate the array substrate having a display region shown in FIG. 3 and a non-display region shown in the FIG. 6, the fabrication step S101 may also include forming a plurality of second wirings 141 on the non-display region 12, in which the plurality of second wirings 141 and the plurality of gate electrodes 111 may be formed at the same layer and by the same material.

Further, the fabrication step S108 may also include forming a plurality of fourth through holes A4 in the non-display-region gate electrode insulating layer 122 and the non-display-region passivation layer 125, such that the touch leading wire 116 may be electrically connected to the second wiring 141 through the fourth through hole A4. The second wiring 141 may be electrically connected to the driving IC.

In the disclosed embodiment, the second wirings 141 in the non-display region 12 and the gate electrodes 111 in the display-region 11 may be formed at the same layer and by the same material. Thus, the second wirings 141 and the gate electrodes 111 may be formed through a same photomask at the same time, reducing the steps of the fabrication process and the fabrication cost. On the other hand, a multi-layer and cross-layer wiring design in the non-display region may be avoided, simplifying the wiring design in the non-display region and improving the production yield.

In another embodiment, to fabricate the array substrate having a display region shown in FIG. 3 and a non-display region shown in the FIG. 7, the fabrication step S104 may also include forming a plurality of second wirings 141' on the non-display region 12, in which the plurality of second wirings 141' and the plurality of second source electrodes (the second drain electrodes) 124 may be formed at the same layer and by the same material.

Further, the fabrication step S108 may also include forming a plurality of fourth through holes A4' in the non-display-region passivation layer 125, such that the touch leading wire 116 may be electrically connected to the second wiring 141' through the fourth through hole A4'. The second wiring 141' may be electrically connected to the driving IC.

In the disclosed embodiment, the second wirings 141' and the second source electrodes (the second drain electrodes) 124 may be formed at the same layer and by the same material. Thus, the second wirings 141' and the second source electrodes (the second drain electrodes) 124 may be formed through a same photomask at the same time, reducing the steps of the fabrication process and the fabrication cost. On the other hand, a multi-layer and cross-layer wiring design in the non-display region may be avoided, simplifying the wiring design in the non-display region and improving the production yield.

In another embodiment, the array substrate may include both the second wirings and the first wirings, in which the second wirings and the first wirings may be formed at the same layer and by the same material. The fourth through holes and the third through holes may be formed in the same fabrication process.

In the disclosed fabrication process of an exemplary array substrate consistent with disclosed embodiments, the top gate electrodes of the driving transistors in the peripheral driving circuit of the non-display region and the touch leading wires in the display region may be formed by the same fabrication techniques and by the same material. Thus, the fabrication of the top gate electrodes and the touch leading wires may only require one etching process, in which individual photomasks may not be required.

On the other hand, the double-gate metal-oxide semiconductor transistors (i.e., the driving transistors) may be formed at the peripheral driving circuit without additional photomasks and fabrication techniques, and the threshold voltage of the metal-oxide semiconductor transistor may get controlled. Further, using the opaque metal layer as the top gate electrode to cover the semi-conductor channel (i.e., the portion of the second active layer between the second source electrode and the second drain electrode), may reduce the photocurrent and eliminate the influence of light irradiation on the stability of metal-oxide semiconductor devices.

Figure 10:
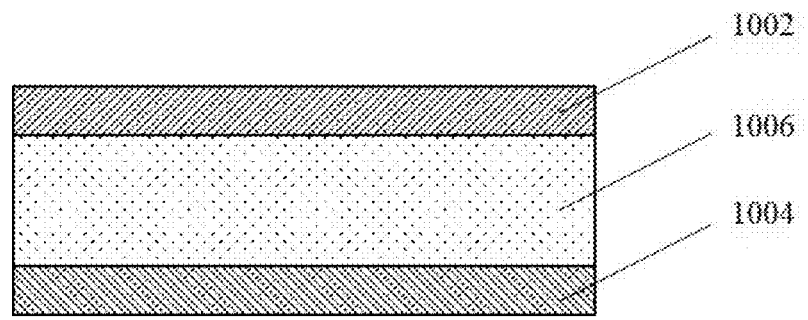
FIG. 10 illustrates a cross-sectional view of an exemplary touch screen consistent with disclosed embodiments.

The present disclosure also provides a touch screen. FIG. 10 illustrates a cross-sectional view of an exemplary touch screen consistent with disclosed embodiments. As shown in FIG. 10, the touch screen may include an array substrate 1002, a color filter substrate 1004 opposite to the array substrate 1002, and a display function layer 1006 disposed between the array substrate and the color filter substrate. In particular, the array substrate may be any one of the disclosed array substrates. The display function layer 1006 may include a display medium, e.g. liquid crystals (LCs), or self-light-emitting elements, e.g. organic light-emitting diodes (OLEDs).

As discussed above, in the disclosed array substrates, the top gate electrodes of the driving transistors in the peripheral driving circuit of the non-display region and the touch leading wires in the display region may be formed by the same fabrication techniques and by the same material. Thus, the fabrication of the top gate electrodes and the touch leading wires may only require one etching process, in which individual photomasks may not be required.

Meanwhile, the double-gate metal-oxide semiconductor transistors (i.e., the driving transistors) may be formed at the peripheral driving circuit without additional photomasks and fabrication techniques, and the threshold voltage of the metal-oxide semiconductor transistor may get controlled. Further, using the opaque metal layer as the top gate electrode to cover the semi-conductor channel (i.e., the portion of the second active layer between the second source electrode and the second drain electrode), may reduce the photocurrent and eliminate the influence of light irradiation on the stability of metal-oxide semiconductor devices.

Because the touch screen may include any one of the disclosed array substrates, the touch screen may also have the same advantages as the disclosed array substrates.

Figure 11:
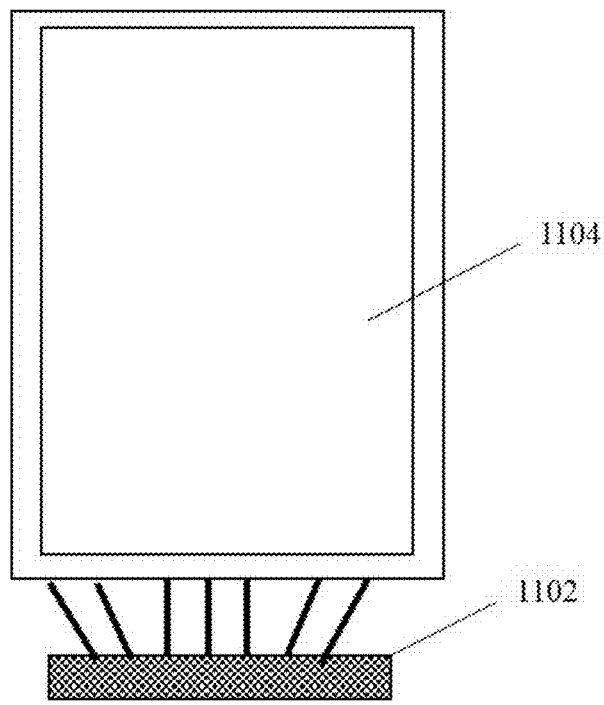
FIG. 11 illustrates a cross-sectional view of an exemplary touch display device consistent with disclosed embodiments.

The present disclosure also provides a touch display device. FIG. 11 illustrates a cross-sectional view of an exemplary touch display device consistent with disclosed embodiments. As shown in FIG. 11, the touch display device may include a driving IC 1102 and a touch screen 1104. The driving IC 1102 may be used for display driving and touch driving. The touch screen 1104 may be any one of the disclosed touch screens. Thus, the touch display device may also have the same advantages as the disclosed touch screens.

The description of the disclosed embodiments is provided to illustrate the present invention to those skilled in the art. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:
1. An array substrate, comprising:
    a base substrate having a display region and a non-display region adjacent to the display region;
    a plurality of touch leading wires disposed in the display region;
    a plurality of touch electrode blocks disposed in the display region and electrically connected to the plurality of touch leading wires;
    a peripheral driving circuit having a plurality of driving transistors disposed in the non-display region, wherein a driving transistor includes a top gate electrode formed at a same layer as a touch leading wire;
    a plurality of displaying transistors disposed in the display region for controlling pixel units; and
    a display-region passivation layer disposed on the plurality of displaying transistors,
    wherein the plurality of touch leading wires are disposed on the display-region passivation layer,
    wherein a displaying transistor includes:
        a gate electrode, a display-region gate electrode insulating layer and, and a first active layer sequentially disposed on the base substrate, and
        a first source electrode and a first drain electrode disposed on the first active layer,
    wherein the driving transistor further includes:
        a bottom gate electrode, a non-display-region gate electrode insulating layer, a second active layer sequentially disposed on the base substrate,
        a second source electrode and a second drain electrode disposed on the second active layer, and a non-display-region passivation layer disposed on the second source electrode and the second drain electrode,
wherein the top gate electrode of the driving transistor is disposed on the non-display-region passivation layer.

2. The array substrate according to claim 1, wherein:
the second active layer is a metal-oxide semiconductor layer including any one of indium gallium zinc oxide (IGZO), indium tin zinc oxide material (ITZO), indium gallium tin oxide (IGTO), indium tin oxide (ITO) and indium zinc oxide (IZO); and
the top gate electrode is an opaque and electrically conductive metal including any one or an alloy of molybdenum, copper, aluminum, silver, titanium, nickel, niobium, neodymium, tantalum and chromium.

3. The array substrate according to claim 1, wherein:
the plurality of touch electrode blocks are disposed on the display-region passivation layer and form a common electrode on the array substrate.

4. The array substrate according to claim 1, further including:
a plurality of pixel electrodes disposed on the display-region passivation layer;
a display-region insulating interlayer disposed on plurality of pixel electrodes; and
a plurality of second through holes penetrating the display-region insulating interlayer,
wherein the touch electrode block is disposed on the display-region insulating interlayer, and the touch electrode block is electrically connected to the touch leading wire through the second through hole.

5. A touch screen including an array substrate according to claim 1.

6. The array substrate according to claim 1, further including:
a plurality of first wirings disposed in the non-display region, wherein the top gate electrode of the driving transistor is electrically connected to the bottom gate electrode of the driving transistor through the first wiring, or the top gate electrode of the driving transistor is electrically connected to a driving integrated circuit (IC) through the first wiring.

7. The array substrate according to claim 6, further including:
a plurality of third through holes penetrating the non-display-region gate electrode insulating layer and the non-display-region passivation layer,
wherein the first wiring and the bottom gate electrode of the driving transistor are formed at a same layer, and
the top gate electrode of the driving transistor is electrically connected to the first wiring through the third through hole.

8. The array substrate according to claim 6, further including:
a plurality of third through holes penetrating the non-display-region passivation layer,
wherein the first wiring and the second source electrode of the driving transistor are formed at a same layer, and
the top gate electrode of the driving transistor is electrically connected to the first wiring through the third through hole.

9. The array substrate according to claim 1, further including:
a plurality of second wirings disposed in the non-display region, wherein the touch leading wire is electrically connected to the driving IC through the second wiring.

10. The array substrate according to claim 9, further including:
a plurality of fourth through holes penetrating the non-display-region passivation layer and the non-display region gate electrode insulating layer,
wherein the second wiring and the bottom gate electrode of the driving transistor are formed at a same layer, and
the touch leading wire is electrically connected to the second wiring through the fourth through hole.

11. The array substrate according to claim 9, further including:
a plurality of fourth through holes penetrating the non-display-region passivation layer,
wherein the second wiring and the second source electrode of the driving transistor are formed at a same layer, and
the touch leading wire is electrically connected to the second wiring through the fourth through hole.

12. A method for fabricating an array substrate, comprising:
providing a base substrate having a display region and a non-display region;
forming a plurality of gate electrodes in the display region and a plurality of bottom gate electrodes in the non-display region at a same layer;
forming a display-region gate electrode insulating layer and a non-display-region gate electrode insulating layer at a same layer;
forming a first active layer in the display region and a second active layer in the non-display region at a same layer;
forming a plurality of first source electrodes and a plurality of first drain electrodes in the display region, a plurality of second source electrodes and a plurality of second drain electrodes in the non-display at a same layer;
forming a display-region passivation layer and a non-display-region passivation layer at a same layer; and
forming a plurality of touch leading wires in the display region and a plurality of top gate electrodes in the non-display region at a same layer,
wherein:
the display region includes a plurality of displaying transistors for controlling pixel units,
the non-display region includes a peripheral driving circuit having a plurality of driving transistors,
a displaying transistor includes:
a gate electrode, the display-region gate electrode insulating layer and, and the first active layer sequentially disposed on the base substrate, and
a first source electrode and a first drain electrode disposed on the first active layer,
a driving transistor includes:
a bottom gate electrode, the non-display-region gate electrode insulating layer, the second active layer sequentially disposed on the base substrate,
a second source electrode and a second drain electrode disposed on the second active layer, and
the non-display-region passivation layer disposed on the second source electrode and the second drain electrode, and
a top gate electrode disposed on the non-display-region passivation layer.

13. The method for fabricating an array substrate according to claim 12, wherein:
the second active layer is a metal-oxide semiconductor layer including any one of indium gallium zinc oxide (IGZO), indium tin zinc oxide material (ITZO), indium gallium tin oxide (IGTO), indium tin oxide (ITO) and indium zinc oxide (IZO); and the top gate electrode is an opaque and electrically conductive metal including any one or an alloy molybdenum, copper, aluminum, silver, titanium, nickel, niobium, neodymium, tantalum and chromium.

14. The method for fabricating an array substrate according to claim 12, further including:
forming a plurality of second wirings when forming the plurality of bottom gate electrodes; and
forming a plurality of fourth through holes penetrating the non-display-region passivation layer and the non-display-region gate electrode insulating layer
wherein the touch leading wire is electrically connected to the second wiring through the fourth through hole, and the second wiring is electrically connected to the driving IC.

15. The method for fabricating an array substrate according to claim 12, further including:
forming a plurality of second wirings when forming the plurality of second source electrodes and the plurality of second drain electrodes; and
forming a plurality of fourth through holes penetrating the non-display-region passivation layer,
wherein the touch leading wire is electrically connected to the second wiring through the fourth through hole, and the second wiring is electrically connected to the driving IC.

16. The method for fabricating an array substrate according to claim 12, further including:
forming a plurality of first wirings when forming the plurality of bottom gate electrodes; and
forming a plurality of third through holes penetrating the non-display-region gate electrode insulating layer and the non-display-region passivation layer;
wherein the top gate electrode is electrically connected to the first wiring through the third through hole,
the first wiring is electrically connected to the bottom gate electrode, or the first wiring and the bottom gate electrode are electrically connected to a driving integrated circuit (IC) respectively.

17. The method for fabricating an array substrate according to claim 16, further including:
forming a plurality of second wirings when forming the plurality of first wirings; and
forming a plurality of fourth through holes penetrating the non-display-region gate electrode insulating layer and the non-display-region passivation layer when forming the plurality of third through holes;
wherein the touch leading wire is electrically connected to the second wiring through the fourth through hole, and the second wiring is electrically connected to the driving IC.

18. The method for fabricating an array substrate according to claim 12, further including:
forming a plurality of first wirings when forming the plurality of second source electrodes and the plurality of second drain electrodes; and
forming a plurality of third through holes penetrating the non-display-region passivation layer;
wherein the top gate electrode is electrically connected to the first wiring through the third through hole,
the first wiring is electrically connected to the bottom gate electrode, or the first wiring and the bottom gate electrode are electrically connected to the driving IC respectively.

19. The method for fabricating an array substrate according to claim 18, further including:
forming a plurality of second wirings when forming the plurality of first wirings; and
forming a plurality of fourth through holes penetrating the non-display-region passivation layer when forming the plurality of third through holes;
wherein the touch leading wire is electrically connected to the second wiring through the fourth through hole, and the second wiring is electrically connected to the driving IC.

20. The method for fabricating an array substrate according to claim 12, wherein:
the plurality of gate electrodes and the plurality of bottom gate electrodes are formed on the base substrate;
the display-region gate electrode insulating layer and the non-display-region gate electrode insulating layer are formed on the base substrate having the gate electrodes and the bottom gate electrodes;
the first active layer and the second active layer are formed on the base substrate having the display-region gate electrode insulating layer and the non-display-region gate electrode;
the plurality of first source electrodes, the plurality of first drain electrodes, the plurality of second source electrodes and the plurality of second drain electrodes are formed on the base substrate having the first active layer and the second active layer;
the display-region passivation layer and the non-display-region passivation layer are formed on the base substrate having the first source electrodes, the first drain electrodes, the second source electrodes and the second drain electrodes; and
the plurality of touch leading wires and the plurality of top gate electrodes are formed on the base substrate having the display-region passivation layer and the non-display-region passivation layer.

21. The method for fabricating an array substrate according to claim 20, wherein:
the first active layer in the display region and the second active layer in the non-display region are formed though patterning a metal-oxide semiconductor layer formed on the base substrate having the display-region gate electrode insulating layer and the non-display-region gate electrode.

22. The method for fabricating an array substrate according to claim 20, further including:
forming a first transparent conductive layer on the base substrate having the touch leading wires and the top gate electrodes.

23. The method for fabricating an array substrate according to claim 22, wherein:
the first transparent conductive layer includes a plurality of touch electrode blocks forming a common electrode.

24. The method for fabricating an array substrate according to claim 22, further including:
forming a display-region insulating interlayer on the base substrate having the first transparent conductive layer, wherein the first transparent conductive layer includes a plurality of pixel electrodes;
forming a plurality of second through holes penetrating the display-region insulating interlayer;
forming a second transparent conductive layer on the base substrate having the display-region insulating interlayer; and
forming a plurality of touch electrode blocks through patterning the second transparent conductive layer, wherein the touch electrode blocks form a common electrode, and the touch electrode block is electrically connected to the touch leading wire through the second through hole.

25. A touch display device, comprising:
a touch screen having an array substrate,
wherein the array substrate comprises:
a base substrate having a display region and a non-display region adjacent to the display region;
a plurality of touch leading wires disposed in the display region;
a plurality of touch electrode blocks disposed in the display region and electrically connected to the plurality of touch leading wires;
a peripheral driving circuit having a plurality of driving transistors disposed in the non-display region, wherein a driving transistor includes a top gate electrode formed at a same layer as a touch leading wire;
a plurality of displaying transistors disposed in the display region for controlling pixel units; and
a display-region passivation layer disposed on the plurality of displaying transistors,
wherein the plurality of touch leading wires are disposed on the display-region passivation layer,
wherein a displaying transistor includes:
a gate electrode, a display-region gate electrode insulating layer and, and a first active layer sequentially disposed on the base substrate, and
a first source electrode and a first drain electrode disposed on the first active layer,
wherein the driving transistor further includes:
a bottom gate electrode, a non-display-region gate electrode insulating layer, a second active layer sequentially disposed on the base substrate,
a second source electrode and a second drain electrode disposed on the second active layer, and
a non-display-region passivation layer disposed on the second source electrode and the second drain electrode,
wherein the top gate electrode of the driving transistor is disposed on the non-display-region passivation layer.

* * * * *